United States Patent [19]

Hunninghaus et al.

[11] Patent Number: 4,628,269

[45] Date of Patent: Dec. 9, 1986

[54] PULSE DETECTOR FOR MISSING OR EXTRA PULSES

[75] Inventors: Roy Hunninghaus, Des Plaines; Edward Q. Almquist, Hoffman Estates, both of Ill.

[73] Assignee: Motorola, Inc., Schaumburg, Ill.

[21] Appl. No.: 613,654

[22] Filed: May 23, 1984

[51] Int. Cl.[4] .......................... H03K 5/19; H03K 5/26
[52] U.S. Cl. .................... 328/120; 328/140; 328/129.1; 328/63; 328/109; 307/269; 307/271; 307/527; 307/518; 377/50
[58] Field of Search ............... 307/269, 271, 480, 527, 307/518, 234, 265; 328/109, 110, 111, 120, 63, 129.1, 136, 72, 75, 138, 140, 141, 133, 134; 377/50; 311/65

[56] References Cited

U.S. PATENT DOCUMENTS

| | | | |
|---|---|---|---|
| 3,566,095 | 2/1971 | Schmitz | 328/63 |
| 3,652,943 | 3/1972 | Piccirilli et al. | 328/120 |
| 3,795,867 | 3/1974 | Jones, Jr. | 328/133 |
| 3,843,871 | 10/1974 | Fujimaki et al. | 235/92 PD |
| 3,930,201 | 12/1975 | Ackermann et al. | 328/1 |
| 4,015,466 | 4/1977 | Stick et al. | 73/116 |
| 4,072,893 | 2/1978 | Huwyler | 324/208 |
| 4,091,425 | 5/1978 | Dakin | 360/38 |
| 4,142,159 | 2/1979 | Ingram et al. | 328/120 |
| 4,152,655 | 5/1979 | Przybyla et al. | 328/120 |
| 4,181,884 | 1/1980 | Shirasaki et al. | 324/208 |
| 4,262,251 | 4/1981 | Fujishiro et al. | 324/208 |
| 4,311,962 | 1/1982 | Titsworth | 328/120 |
| 4,345,209 | 8/1982 | Walker | 328/120 |
| 4,358,828 | 11/1982 | Reid et al. | 364/565 |
| 4,378,004 | 3/1983 | Petrie | 123/643 |
| 4,379,993 | 4/1983 | Holden | 328/120 |
| 4,427,948 | 1/1984 | Rinaldi | 328/120 |
| 4,446,437 | 5/1984 | Rinaldi | 328/120 |

*Primary Examiner*—Stanley D. Miller
*Assistant Examiner*—Richard Roseen
*Attorney, Agent, or Firm*—Phillip H. Melamed; James W. Gillman

[57] ABSTRACT

A missing pulse detector is disclosed in which the absence of a pulse in a variable frequency periodic pulse train is detected and distinguished from a reduction in the pulse repetition rate. Between successive pulse train pulses a first counter counts clock pulses at a first rate and develops a maximum count related to the time duration between successive pulses. This maximum count is maintained by a latch circuit during the next time duration between successive pulses and is compared with the count of a second pulse counter which counts clock pulses during successive pulse train pulses at a second rate normally less than the first incrementing rate. When the count of the second counter exceeds by a predetermined amount the latched count of the first counter, this indicates the occurrence of longer time duration and a count comparator and logic circuit provides an arming output signal. In response to the arming output signal, the incrementing rate of the second pulse counter is increased to a third rate which exceeds the first incrementing rate. If after the arming output signal the maximum count of the second counter between successive pulses is less than the maximum count achieved by the first counter between preceding successive pulses, then a missing pulse detection signal is produced.

23 Claims, 5 Drawing Figures

PULSE DETECTOR FOR MISSING OR EXTRA PULSES

CROSS REFERENCE TO RELATED APPLICATIONS

The present invention is related to the invention described in a copending U.S. patent application by Zbynek A. Capurka, entitled, "Reference Pulse Verification Circuit Adaptable for Engine Control", Ser. No. 06/613,653 filed, May 23, 1984, and assigned to the same assignee as the present invention, now U.S. Pat. No. 4,553,426.

BACKGROUND OF THE INVENTION

The present invention relates generally to the field of pulse detectors in which a missing or extra pulse in a variable frequency periodic pulse train is detected. More specifically, the present invention relates to such pulse detectors which are adaptable for use in engine control systems in which a variable frequency periodic pulse train produced by sensing the passage of fixed projections or notches on a wheel rotated by an engine crankshaft, especially wherein the detection of a missing or extra pulse is used to identify a predetermined engine crankshaft reference rotational position.

In prior engine control systems, it is typically necessary to identify a reference rotational position of the engine crankshaft in order to initiate the proper sequencing of engine control signals to the engine cylinders for implementing spark/dwell control and/or fuel injection control. Also, for engine control it may be necessary to sense the speed of rotation of the crankshaft and provide pulses which occur at regular closely spaced intervals of crankshaft rotation. Typically such systems utilize a sensor to sense the passage of a number of projections on a wheel rotated by an engine crankshaft and in some systems the occurrence of a reference rotational position of the engine crankshaft is indicated by the absence of one of these projections resulting in a corresponding absence of a periodic pulse being provided by the sensor. Missing pulse detectors have been used in such engine control systems wherein these detectors attempt to determine when a pulse is absent in a variable frequency periodic pulse train provided in accordance with the rotation of an engine crankshaft. Typically all of these prior missing pulse detectors develop either an analog or digital signal related to the time duration between successive pulse train pulses, and these prior detectors conclude that a missing pulse has occurred when the time duration between successive pulses exceeds by a predetermined amount the time duration between preceding successive pulses. While this method is feasible for determining the existence of a missing pulse in a pulse train, clearly this technique is subject to misinterpreting any substantial deceleration in the occurrence rate of the pulse train pulses as the existence of a missing pulse, especially when this deceleration is abrupt. None of the prior pulse detectors apparently attempts to minimize this potential erroneous mode of operation in which a reduction in the frequency of the periodic pulse train can be mistaken for the occurrence of a missing pulse train pulse.

In some systems, it is possible to determine a reference position by providing an additional projection on a rotating wheel having a number of spaced projections, rather than by removing one of the projections to create a missing pulse. In such systems, again it is believed that the detectors utilized therewith determine the existence of this extra pulse corresponding to a reference location by comparing the time duration between pulses with the time duration that existed between preceding pulses. Such systems are likely to misinterpret an acceleration in the frequency of the periodic pulse train pulses as the existence of an extra pulse, and the prior systems have no satisfactory way of distinguishing between the occurrence of a true extra pulse and an abrupt acceleration of the frequency of the periodic pulse train.

SUMMARY OF THE INVENTION

An object of the present invention is to provide an improved pulse detector which more reliably determines a missing or extra pulse in a variable frequency periodic pulse train, and which overcomes the above discussed disadvantages of the prior art pulse detectors.

In one embodiment of the present invention there is provided a pulse detector for producing an output signal in response to either the absence of a pulse or the occurrence of an extra pulse in a variable frequency periodic pulse train. The pulse detector of the present invention comprises: first means for receiving a pulse train signal comprising periodic pulses and providing an arming output signal in response to a second time duration between successive pulse train pulses exceeding in one polarity sense by a first predetermined amount a first preceding time duration between successive pulse train pulses, and second means coupled to said first means for receiving said arming output signal and providing a pulse detection output signal in response to the occurrence of said arming output signal and a third time duration between successive pulse train pulses subsequent to said second time duration exceeding in an opposite polarity sense by a second predetermined amount said second time duration, whereby the occurrence of a missing or extra pulse is indicated by said pulse detection output signal and is more readily distinguishable from a reduction or increase in the repetition rate of the pulse train pulses.

Essentially, the present invention determines the absence of a pulse or the presence of an additional pulse by comparing the time duration between successive pulses with the time duration between preceding successive pulses. If this comparison indicates the likelihood of the occurrence of a missing or extra pulse, the present invention then analyzes a third time duration which exists after the second time duration and until the occurrence of the next pulse train pulse and utilizes this subsequent time duration to verify if a true missing or extra pulse detection has occurred or if a reduction or increase in the repetition rate of over large number of pulse train pulses caused the arming output signal. While preferably the present invention is applicable to a missing pulse detector, the broader concepts of the present invention are applicable to extra or additional pulses detectors even though systems using such extra pulse detectors may be less noise immune.

The preferred embodiment of the present invention involves utilizing a first counter which develops a peak accumulated pulse count during each time duration between successive pulses wherein this peak count corresponds to a time duration signal related to the time between successive pulses. This is accomplished by having the first counter count a number of clock pulses occurring at a first high frequency between successive pulse train pulses. A second pulse counter is utilized for counting a plurality of clock pulses occurring at a lower frequency between successive pulse train pulses. The accumulated count of the second counter between pulse train pulses is effectively compared with the peak count of the first counter developed in response to the preceding time period between successive pulse train pulses. In response to this effective comparison it can be readily determined when the time duration between successive pulses is either substantially greater or substantially less than the preceding time duration between successive pulses. It should be noted that this effective comparison does not need to be implemented by a counter comparator but can be accomplished by merely utilizing the peak counts between successive pulses provided by the first counting apparatus to influence the counting of the second counting apparatus.

In response to the occurrence of an excessivly large or small time duration between pulse train pulses as compared with the preceding pulse train pulse time duration, an arming output signal is produced which indicates the likelihood of either an additional or missing pulse. In response to the occurrence of this arming signal, the preferred embodiment of the present invention provides for developing an accumulated count related to the next time duration between successive pulses. This next time duration accumulated count is then effectively compared with a preceding time duration accumulated count and a pulse detection output signal is produced in response to the effective count comparisons revealing that a middle time duration between successive pulses exceeded in one polarity sense the preceding time duration whereas the next time duration accumulated count exceeded a middle time duration accumulated count in an opposite polarity sense. Preferably, the incrementing rate for the count related to the next time duration to be compared with the middle time duration after the occurrence of the arming signal will exceed the incrementing rate utilized for the counts related to the preceding and middle time durations, whereas the incrementing rate for the middle time duration which is to be compared with the preceding time duration is less than the incrementing rate for the preceding time duration. This aids in reliably implementing the present invention and insuring that a pulse detection output signal will be less likely to be generated in response to a general reduction or increase in the repetition rate of the pulse train pulses.

BRIEF DESCRIPTION OF THE DRAWINGS

For a more complete understanding of the present invention reference should be made to the drawings, in which.

DESCRIPTION OF THE PREFERRED EMBODIMENTS

Figure 1:
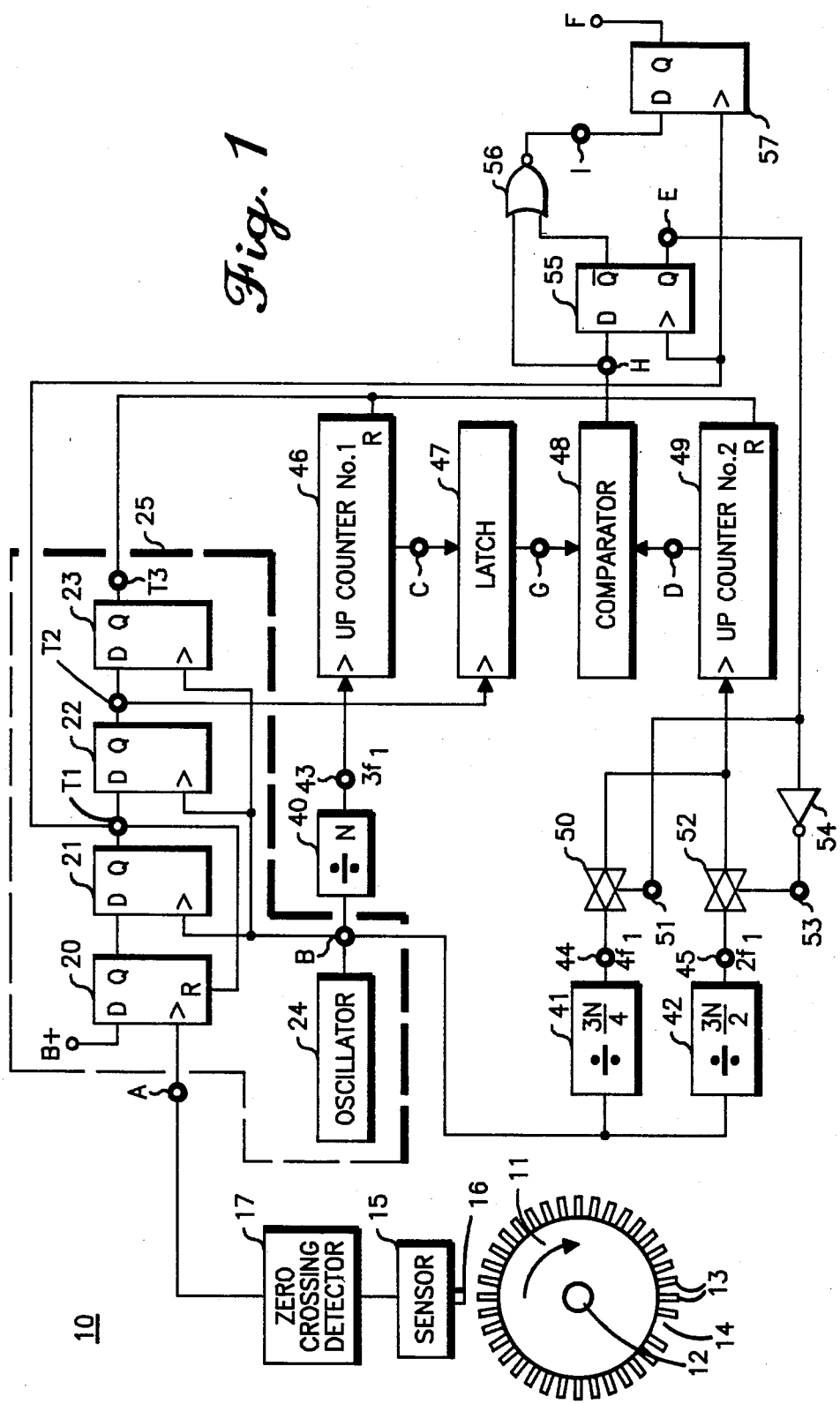
FIG. 1 is a schematic diagram of a missing pulse detection system which utilizes the present invention.

Referring to FIG. 1, a missing pulse detection system 10 is illustrated which cmprises a wheel 11 rotated about an axis 12 wherein the wheel has a number of uniformly spaced projecting teeth 13 and a missing tooth location 14. A sensor 15, which may be of the reluctance or Hall effect type, is positioned so that an active sensing area 16 of the sensor is fixed with respect to the rotating wheel 11 and senses the passage of the projecting teeth 13. The sensor 15 is directly connected to and provides an input to a zero crossing detector 17 which receives the sensor output signal and provides squared up pulses in response thereto at an output terminal A. The squared up output pulses comprise a variable frequency pulse train signal comprising a sequence of pulses corresponding to the passage of each of the teeth 13 past the sensing area 16.

It should be noted that preferably the axis 12 in the missing pulse detection system 10 corresponds to the axis of a crankshaft of an internal combustion engine of an automobile. The system 10 is intended for utilization in providing a reference pulse indicating the existence of a reference rotational position of the engine crankshaft which is to be used for sequencing engine control signals which determine the engine crankshaft rotation. The missing tooth location 14 corresponds to a predetermined reference position of the engine crankshaft and the detection signal provided by the missing pulse detection system 10 will be produced in response to the passage of the missing tooth location 14 past the sensing area 16. In should be noted that in the copending U.S. patent application referred to above an engine control system which utilizes the missing pulse detector apparatus of the present invention is disclosed. However, it should be noted that the pulse detection system of the present invention is usable in other engine control systems, and in any systems in which the existence of a missing or additional pulse in a variable frequency pulse train is desired to be detected.

The terminal A in FIG. 1 is directly connected as an input to a clock terminal of a flip-flop 20 which has its data terminal D connected to a positive terminal B+ and its output terminal Q connected to a data terminal D of a flip-flop 21. An output terminal Q of flip-flop 21 is directly connected to a terminal $T_1$ which is connected as an input to a data terminal D of a flip-flop 22 and is connected to a reset terminal R of the flip-flop 20. An output terminal Q of the flip-flop 22 is connected to a terminal $T_2$ which is connected as an input to a data terminal D of a flip-flop 23 which has an output terminal Q connected to an output terminal $T_3$. A constant high frequency clock oscillator 24 is connected to a terminal B at which constant high frequency clock pulses are provided which have a frequency greatly exceeding the expected repetition frequency of the pulse train pulses provided at the terminal A. The terminal B is connected to clock terminals of the flip-flops 21, 22 and 23.

Essentially the components 20 through 24 represent a synchronizing and delay circuit 25, shown dashed in FIG. 1, which receives the pulse train signal at the terminal A and provides in response thereto synchronized corresponding pulse train signals at the terminals $T_1$, $T_2$ and $T_3$, with the signal at the terminal $T_2$ being delayed by a short fixed amount from the signal at the terminal $T_1$, and the signal at the terminal $T_3$ being identically delayed with respect to the signal at the terminal $T_2$. The operation of the synchronizing and delay circuit 25 can best be understood by referring to FIG. 2 in which the signal waveforms at the terminals A, B, T₁, T₂ and T₃ are illustrated in graphs identified by identical reference letter notation.

Figure 2:
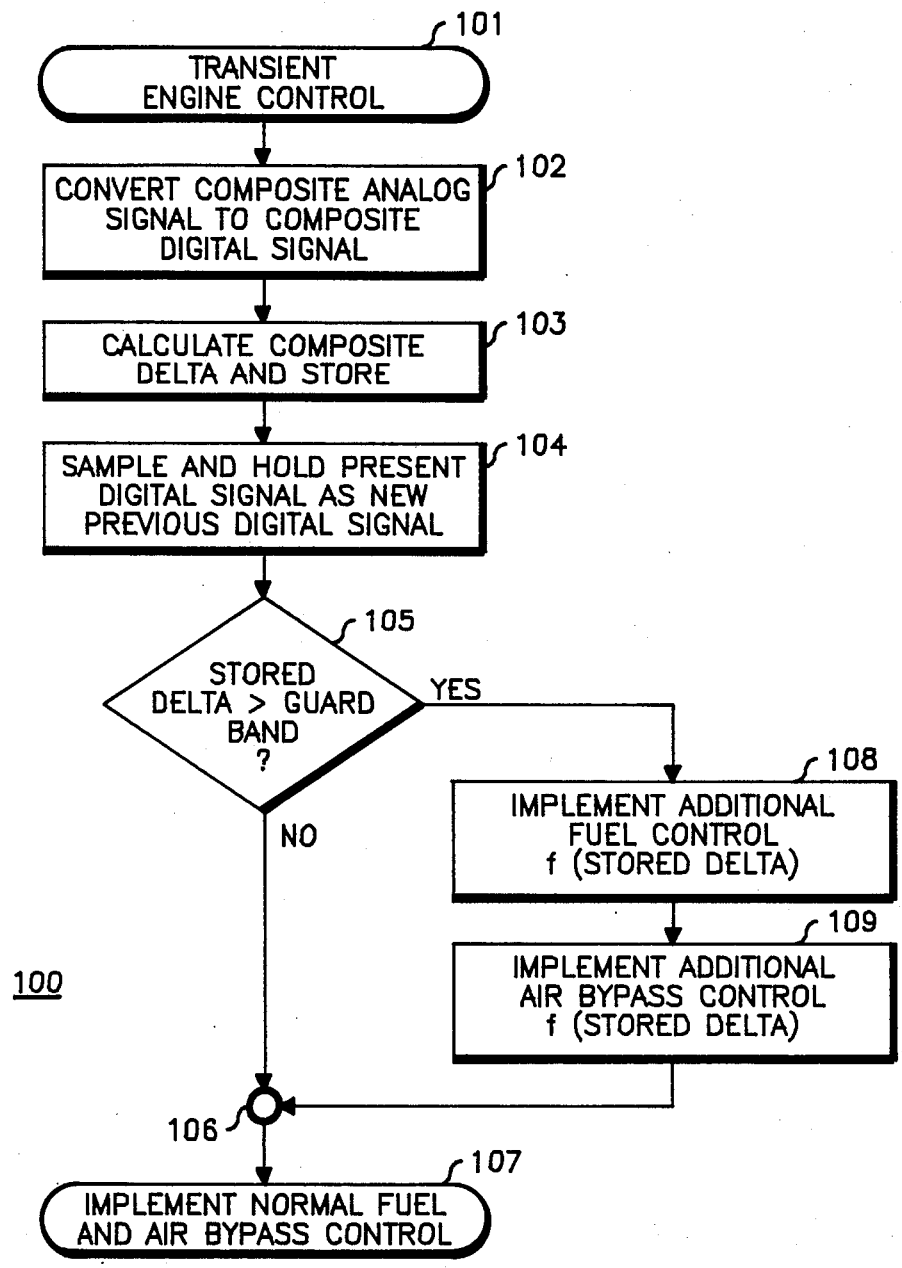
FIG. 2 is a series of graphs which illustrate the signal waveforms produced by a portion of the system shown in FIG. 1.

In the graphs in FIG. 2 the vertical axes are representative of magnitude and the horizontal axes are representative of time with each of the FIG. 2 graphs drawn with an identical time scale. Graph A in FIG. 2 illustrates a pulse train signal 30 comprising a series of individual pulses each pulse provided at the terminal A in response to the passage of each one of the teeth 13. Graph B in FIG. 2 illustrates a constant high frequency clock pulse signal 31 provided by the oscillator 24 at the terminal B. Essentially the synchronizing and delay circuit 25 responds to the leading edge of each of the pulses in the pulse train signal 30 by providing at the terminals $T_1$ through $T_3$ corresponding synchronized pulses having a time duration equal to the period of the clock signal 31 and synchronized therewith with the signal at $T_2$ being delayed from the signal at $T_1$ by one period of the clock signal 31 and the signal at the terminal $T_3$ being delayed with respect the signal at the terminal $T_2$ by one clock period of the signal 31. The signals at the terminals $T_1$ through $T_3$ are designated 32, 33, 34, respectively, and are also sometimes designated herein as $T_1$, $T_2$, and $T_3$, respectively.

Essentially, the synchronizing and delay circuit 25 merely responds to the pulse train signal 30 to produce short duration, synchronized but delayed signals 32 through 34 wherein these signals are utilized to insure the proper timing of the pulse detection apparatus of the present invention. In addition, a high frequency clock signal is provided at the terminal B. It should be noted that the leading edges of the signals $T_1$, $T_2$ and $T_3$ occur just after and in response to each leading edge transition of the signal 30. The construction and operation of the synchronizing and delay circuit 25 is conventional and does not form an essential part of the present invention since other similar synchronizing and delay circuits can be utilized to accomplish the same end result.

Referring again to FIG. 1, the terminal B at which the high frequency clock signal 3 is provided is connected as an input to three frequency dividers 40, 41 and 42. Divider 40 implements a divide by N frequency division and provides an output at a terminal 43. Divider 41 implements a divide by (3N)/4 and provides an output at a terminal 44. Divider 42 implements a divide by (3N)/2 and provides an output at a terminal 45. Preferably the value of N is 4 such that, assuming that the frequency of the clock signal at the terminal B is equal to $12f_1$, then the signals at the terminals 43 through 45 have the frequencies $3f_1$, $4f_1$ and $2f_1$, respectively. The signals at the terminals 43 through 45 are constant high frequency clock signals which will be used for pulse counter incrementing so as to provide incrementing rates which have a predetermined relationship to one another. Thus the incrementing rate provided by the signal at the terminal 43 exceeds by a factor of 1.5 the incrementing rate of the signal at the terminal 45 and is ¾ of the incrementing rate of the signal at the terminal 44. The significance of this will be explained in detail subsequently.

The terminal 43 is connected to the count terminal of a first up counter 46 which has a reset terminal R directly connected to the terminal $T_3$ and provides an accumulated count signal for the counter 46 at a terminal C. The terminal C is connected as an input to a latch circuit 47 which has a clock terminal directly connected to the terminal $T_2$. This connection results in the latch 47 receiving and storing the count at the terminal C in response to each leading edge of a pulse provided at the terminal $T_2$ wherein this count is maintained until the next leading edge results in clocking the latch 47. The stored count output of the latch 47 is provided at a terminal G which is connected as an input to a count comparator 48 which receives an additional count for comparison via a direct connection to a terminal D and provides an output at a terminal H. The output provided by the comparator 48 is high (a positive logic state) when the count at the terminal D exceeds the count at the terminal G.

A second up counter 49 provides its accumulated count as the input to the terminal D and has a reset terminal R connected to the terminal $T_3$. The counting input terminal of the counter 49 is connected to the terminal 44 through the series terminals of a gate 50 and is connected to the terminal 45 through the series terminals of a gate 52. A control terminal 51 of the gate 50 is connected through an inverter 54 to a control terminal 53 of the gate 52. These connections result in the alternate connection of the count terminal of the counter 49 to the terminals 44 or 45 in accordance with whether a high or low logic state is provided at the terminal 51. It should be noted that the count connections to the terminals C, G and D corresponds to a plurality of binary logic connections rather than a single connection as shown in FIG. 1.

The terminal H is directly connected to a data terminal D of a flip-flop 55 which has an output terminal Q connected to an output terminal E directly connected to the terminal 51. An output terminal $\overline{Q}$ of the flip-flop 55 is connected as an input to a NOR gate 56 which receives an additional input via a direct connection to the terminal H and provides an output at a terminal I which is connected as an input to a data terminal D of a flip-flop 57. An output terminal Q of the flip-flop 57 is directly connected to a missing pulse detection output terminal F. Clock terminals of the flip-flops 55 and 57 are connected together and directly connected to the terminal $T_1$. The components 55 through 57 and 50 through 54 comprise apparatus which in response to the production of an arming output signal at the terminal E alters the incrementing rate of the counter 49 and results in the production of a missing pulse detection signal at the terminal F in response to determining that a middle or second time duration between successive pulse train pulses of the signal 30 at the terminal A exceeded by more than a factor of 1½ the preceding or first time duration between pulse train pulses, and wherein the next or third pulse train time duration between pulses is determined as being less than ¾ of the second or middle pulse train time duration. The manner in which the pulse detection system of Figure 1 accomplishes this will now be explained in conjunction with the signal waveforms illustrated in FIG. 3.

Figure 3:
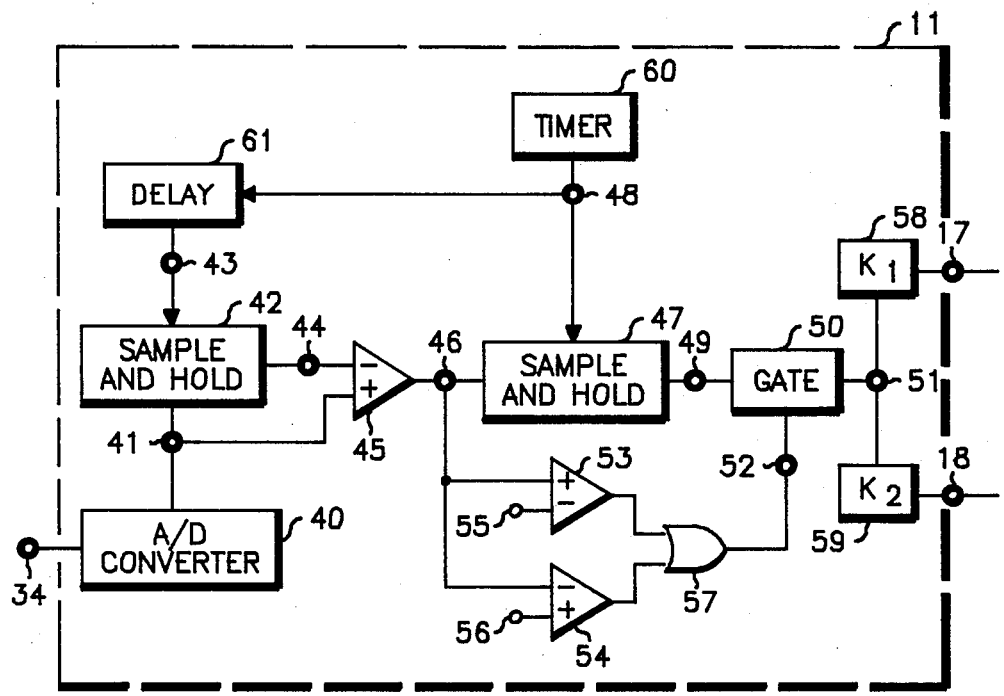
FIG. 3 is a series of graphs which illustrate signal waveforms provided by additional portions of the system shown in FIG. 1.

In FIG. 3, the vertical axes are representative of magnitude and the horizontal axes are representative of time wherein the time scale for all of the waveforms in FIG. 3 are identical. It should be noted that the time scale for the waveforms shown in FIG. 2 is greatly expanded with respect to the time scale for the waveforms in FIG. 3 since the clock signal 31 in graph B of FIG. 2 has a frequency far in excess of the most rapid repetition rate expected for the signal 30.

In graph A' in FIG. 3 the signal 30 is illustrated as comprising a pulse train represented by a series of 15 pulses $t_1$ through $t_{15}$. In FIG. 3 each of these pulses is represented by an impulse whereas in the greatly expanded time scale of FIG. 2 each pulse corresponds to a squarewave pulse. It should be noted that if the signals 32 through 34 were illustrated in graph A' of FIG. 3 simultaneously with the signal 30, the graph A' would look identical since the time scale in FIG. 2 is greatly expanded with respect to the time scale in FIG. 3 and the signals 32–34 are only slightly delayed from the signal 30. However, it should be noted that the slightly delayed time occurrences of the signals 32 to 34 with respect to each other does exist and in the remaining waveforms shown in FIG. 3 designations of $T_1$, $T_2$ or $T_3$ will be utilized to indicate the appropriate time transitions of these waveforms.

The graph C in FIG. 3 illustrates a signal waveform 60 which is representative of the accumulated count of the counter 46 at the terminal C. It should be noted that the waveform of signal 60 essentially appears as a saw tooth wave with an incrementing rate corresponding to the frequency $3f_1$ and the count of the counter 46 being reset to zero in response to each $T_3$ leading edge transition. In graph D in FIG. 3, the accumulated output of the counter 49 is illustrated as a saw tooth signal 61 with the count of the counter being reset upon leading edge transitions of the signal $T_3$ and the rate of incrementing of the counter being selectively varied between a normal incrementing rate corresponding to $2f_1$ and a rapid incrementing rate corresponding to $4f_1$. Superimposed on the graph D in FIG. 3 is a signal 62 shown dashed and corresponding to the latched output count provided at the terminal G. It should be noted that this latched output count represents the peak count of the counter 46 at the time of a leading edge of the signal $T_2$ which immediately precedes the resetting of the counter 46 at the subsequent leading edge of the signal $T_3$. The reason that the signal 62 has been superimposed upon the signal 61 in FIG. 3, is that this better illustrates the operation of the comparator 48 which compares these two signals to provide a signal 63 at the terminal H shown in graph H in FIG. 3. Graphs E, I and F in FIG. 3 also illustrate signals 64, 65 and 66 provided at the terminals E, I and F in FIG. 1, respectively. The operation of the pulse detection system 10 in FIG. 1 will now be explained in detail with respect to the signal waveforms shown in FIG. 3.

In response to each successive pulse of the pulse train signal 30, the count of the counters 46 and 49 are reset to zero and then these counters are upward incremented. For the pulse train pulses $t_1$ through $t_4$, equal time durations between these pulse train pulses are illustrated in FIG. 3. This results in the upward incrementing of the count of the counter 46 at a rate of $3f_1$ until it reaches a peak count immediately prior to the leading edge of the signal $T_3$. At the leading edge of the signal $T_2$ this peak count is transferred to the latch circuit 47 where it is maintained as the magnitude of the signal 62 at the terminal G until the next clocking of the latch circuit 47. Graph D in FIG. 3 illustrates that in response to the pulse train pulses $t_1$ through $t_4$ the second counter 49 is incremented upward at a slower rate of $2f_1$, and this results in the peak count of the counter 49 being less than the latched peak count of the counter 46, which was incremented at the higher rate of $3f_1$, when equal time durations exist between successive pulse train pulses.

For the time durations between the pulse train pulses $t_4$ through $t_7$ a gradual reduction (deceleration) in the repetition rate of the pulse train signal 30 has been illustrated. The end result is that during this time the signal 60 will reach slightly higher peak magnitudes just prior to pulses $t_5$ to $t_7$ resulting in slightly higher latched peak signals being provided as the signal 62, while also correspondingly slightly higher peak magnitudes of the signal 61 will be reached. As shown in FIG. 3, during these times the deceleration in the repetition rate of the signal 30 is not so abrupt that the time period between successive pulse train pulses is more than 1½ times the preceding time period. The end result is that the peak magnitude of the signal 61 does not exceed the latched peak magnitude of the signal 60 at any time in response to the pulse train pulses $t_1$ through $t_7$. This results in a low logic signal being maintained at the terminal H which in turn results in a low signal at the pulse detection output terminal F and a low signal at the arming output signal terminal corresponding to the terminal E.

In FIG. 3, the time durations between the pulse train pulses $t_6$ to $t_7$, $t_7$ to $t_8$ and $t_8$ to $t_9$ are identical, and this pulse train time interval is represented by the time duration $td_1$. This is representative of a steady state repetition rate for the signal 30 after the moderate deceleration which occurred between the pulse train pulses $t_4$ and $t_7$. As was previously noted, during a condition of no or only slight deceleration there will be no output change in the signal at the terminal H and this will result in no output signal change at the terminals E or F. In the interest of completeness it should be noted that if an acceleration condition existed for the signal 30 after a constant repetition rate had occurred, then similarly no output signal would exist at the terminal H since the latched peak magnitude signal 62 would always exceed the incremented signal 61. This is because the signal 61 would be incremented at a slower rate than the signal 60, and during acceleration the signal 61 would be compared to prior higher peak magnitudes of the faster incremented signal 60.

It is significant to note that the present missing pulse detection system 10 operates so as to effectively compare the magnitude of an accumulated count related to the time duration between successive pulse train pulses with a latched peak accumulated count related to the preceding time duration which existed between pulse train pulses. With regard to the graphs shown in FIG. 3, this is illustrated by the present invention implementing the comparison of the signal 61 with the latched signal 62 that represents the peak magnitude of an accumulated count representative of the time duration of a preceding duration between pulse train pulses.

Referring to FIG. 3, between the pulse train pulses $t_9$ and $t_{10}$ a substantial time duration $td_2$ equal to twice the duration $td_1$ exists which corresponds to the occurrence of the missing tooth location 14. This is followed by a pulse duration $td_3$ between the pulse train pulses $t_{10}$ and $t_{11}$ and $t_{11}$ to $t_{12}$ wherein the duration $td_3$ is illustrated as being equal to the duration $td_1$. Thus in FIG. 3, between the pulse train pulses $t_7$ and $t_{12}$ a constant repetition rate has been illustrated for the pulse train pulses of the signal 30. In response to the substantial second time duration $td_2$ the signal 60 will increment at a rate of $3f_1$ up to a substantially higher peak count, whereas during the subsequent third time duration $td_3$ between $t_{10}$ and $t_{11}$ this signal will again be incremented only up to the maximum end count which existed at the time $t_9$. This is illustrated in the signal 62 shown in FIG. 3 by the much larger latched magnitude of this signal during the time duration $t_{10}$ to $t_{11}$ followed by the lower latched magnitude during the time duration from $t_{11}$ to $t_{12}$ which is equal to the latched magnitude between pulses $t_7$ to $t_{10}$.

During the second time duration $td_2$, the count of the second counter 49 will be incremented upward at the rate $2f_1$ until the time corresponding to the leading edge of the signal $T_3$ just after the time $t_{10}$. At an interim time of $t_m$ the count of the counter 49 will exceed the latched count provided at the terminal G and this will result in the comparator 48 providing a high logic signal at the terminal H. This high signal will be $T_1$ just maintained past the leading edge of the signal after $t_{10}$ since the latched count is changed on the leading edges of the signal $T_2$ and the count of the counter 49 is reset on the leading edge of the signal $T_3$. Thus at the leading edge of signal $T_1$ when the flip-flop 55 is clocked, a high logic state will be provided at the terminal H which will result in setting the signal at the terminal E high wherein this signal is representative of an arming output signal illustrated as the signal 64 in FIG. 3. This signal 64 is provided in response to the present invention comparing an accumulated count related to the second time duration $td_2$ with a latched accumulated end count related to the preceding time duration $td_1$.

Essentially, due to the incrementing rates selected for the present embodiment, when the second time duration exceeds by a factor of 1.5 the preceding time duration, the signal 63 at the terminal H will go high and this will result in providing an arming signal pulse at the terminal E. In prior pulse detector circuits the signal at the terminal E was utilized as the missing pulse detection system output signal. However clearly a high signal at this terminal can be provided merely in response to an abrupt deceleration or reduction in the repetition rate of the signal 30, and therefore does not reliably represent the detection of a missing pulse. The present invention avoids this problem by then relying on the next or third pulse duration $td_3$ to verify if a true missing pulse detection has been obtained. This is accomplished in the following manner.

In response to the high logic state of the arming signal 64 provided at the terminal E, the incrementing rate of the counter 49 is altered to twice its normal incrementing rate by selecting an input pulse counting frequency of $4f_1$ instead of $2f_1$. This is accomplished by virtue of the series pass gates 50 and 52 which in response to a positive signal at their respective control terminals act as series short circuits whereas in response to low logic signals at these terminals the gates act as series open circuits. In response to the leading edge of the signal $T_2$ just after the time $t_{10}$, the latched output at the terminal G will be stepped up to a higher value representative of the end peak value obtained by the signal 60 at the time $t_{10}$. In response to the subsequent rising edge of the signal $T_3$ just after the time $t_{10}$ the count of the counter 49 will be set to zero, and because of the high logic signal 64 at the terminal E the counter 49 will be then incremented at a rapid rate of $4f_1$. Even with this substantially more rapid incrementing rate during the time duration $td_3$, at the time $t_{11}$ the peak magnitude of the signal 61 will not exceed the latched magnitude of the signal 62 prior to the leading edge of signal $T_2$ just after $t_{11}$. The end result is that at the occurrence of the leading edge of the signal $T_1$ just after the time $t_{11}$, a low logic signal is provided at the terminal H. This results in setting the arming signal 64 at the terminal E low at this leading edge of the signal $T_1$. The NOR gate 56 and flip-flop 57 respond to this by setting a missing pulse detection output signal 66 at the terminal F high thereby indicating the existence of a missing pulse detection. This signal will remain high until the occurrence of the next leading edge of the signal $T_1$ corresponding to just after the time $t_{12}$.

In the above manner the present invention has required that a missing pulse detection not be produced just in response to determining that the second time duration $td_2$ is greater than the first time duration $td_1$, by a predetermined amount, but has provided a missing pulse detection in response to additionally determining that the subsequent time duration $td_3$ is a predetermined amount less than the longer time duration $td_2$. Under these conditions a true missing pulse detection signal is provided as indicated by a high logic state of the signal 66.

It should be noted that when the flip-flop 57 is clocked by the leading edge of the signal $T_1$, even though the leading edge of the signal $T_1$ also resets the flip-flop 55, because of the propagation delay in the flip-flop 55 responding to the signal $T_1$, the signal 65 at the terminal I will remain high at the leading edge of $T_1$ just after $t_{11}$ for a very short time resulting in the high logic state being created at the terminal F. It should also be noted that the short duration pulse of signal 63 at terminal H between the leading edges of the times $T_2$ and $T_3$ just after the time $t_{11}$ is of no consequence since it is not present in the signal 65.

It should be noted that the preferred embodiment of the present invention will produce a high arming output signal at the terminal E in response to a second time duration $td_2$ exceeding a preceding time duration $td_1$ by more than a factor of 1.5 corresponding to the ratio between the incrementing rates $3f_1$ and $2f_1$. In order to produce a missing pulse detection, a subsequent time duration $td_3$ must exist wherein this time duration is less than $\frac{3}{4}$ of the longer time duration $td_2$ wherein this relationship is determined by the ratio between the incrementing rates $3f_1$ and $4f_1$. This insures that a missing pulse detection cannot be provided merely in response to an abrupt deceleration of the pulse train signal 30. This is further illustrated in FIG. 3 by the pulse train pulses $t_{13}$ through $t_{15}$ wherein the time durations between the pulse train pulses $t_{12}$ through $t_{15}$ are equal but exceed by a factor of more than 1.5 the time duration between the pulse train pulses $t_{11}$ and $t_{12}$. In this instance the waveforms shown in FIG. 3 illustrate that again an arming output signal high logic state is provided at the terminal E at substantially the time $t_{13}$, but this alone does not result in providing a missing pulse detection signal at the terminal F because the more rapidly incremented count of the signal 61 after $t_{13}$ will now exceed the latched signal 62 at the terminal G prior to the clocking of the flip-flop 55. This results in maintaining a high state for the arming signal at the terminal E which in turn prevents the creation of a high state in the missing pulse detection signal at the terminal F. It is contemplated that this situation will remain until a true missing pulse detection occurs as represented by a second time duration greatly exceeding a preceding time duration and subsequently followed by a third time duration substantially less than the second time duration.

It should be noted that the pulse detection system 10 can generate an erroneous missing pulse detection if an abrupt substantial deceleration of the rotating wheel occurs and is then followed by an aburpt substantial acceleration prior to the actual occurrence of a true missing pulse detection in response to the missing pulse location 14. However, this possibility is not substantial since the deceleration and acceleration must both occur between consecutive missing pulse locations 14, and typically in engine control systems utilizing a rotating wheel such as the wheel 11 these conditions will not occur. However, in prior systems just an abrupt deceleration during one crankshaft revolution would generate false missing pulse detection signals, whereas the present invention clearly prevents such erroneous operation.

Figure 4:
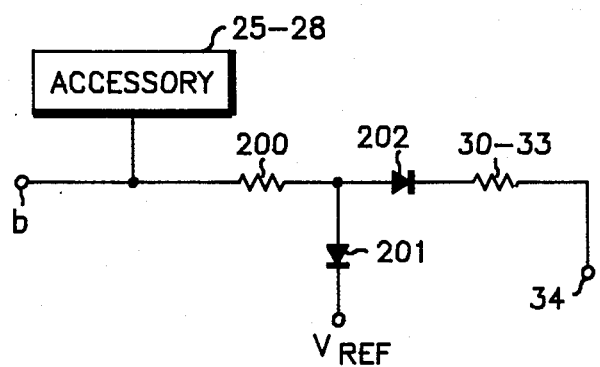
FIGS. 4 and 4A illustrate schematic diagrams of alternate equivalent embodiments for some of the components shown in FIG. 1.
Figure 4A:
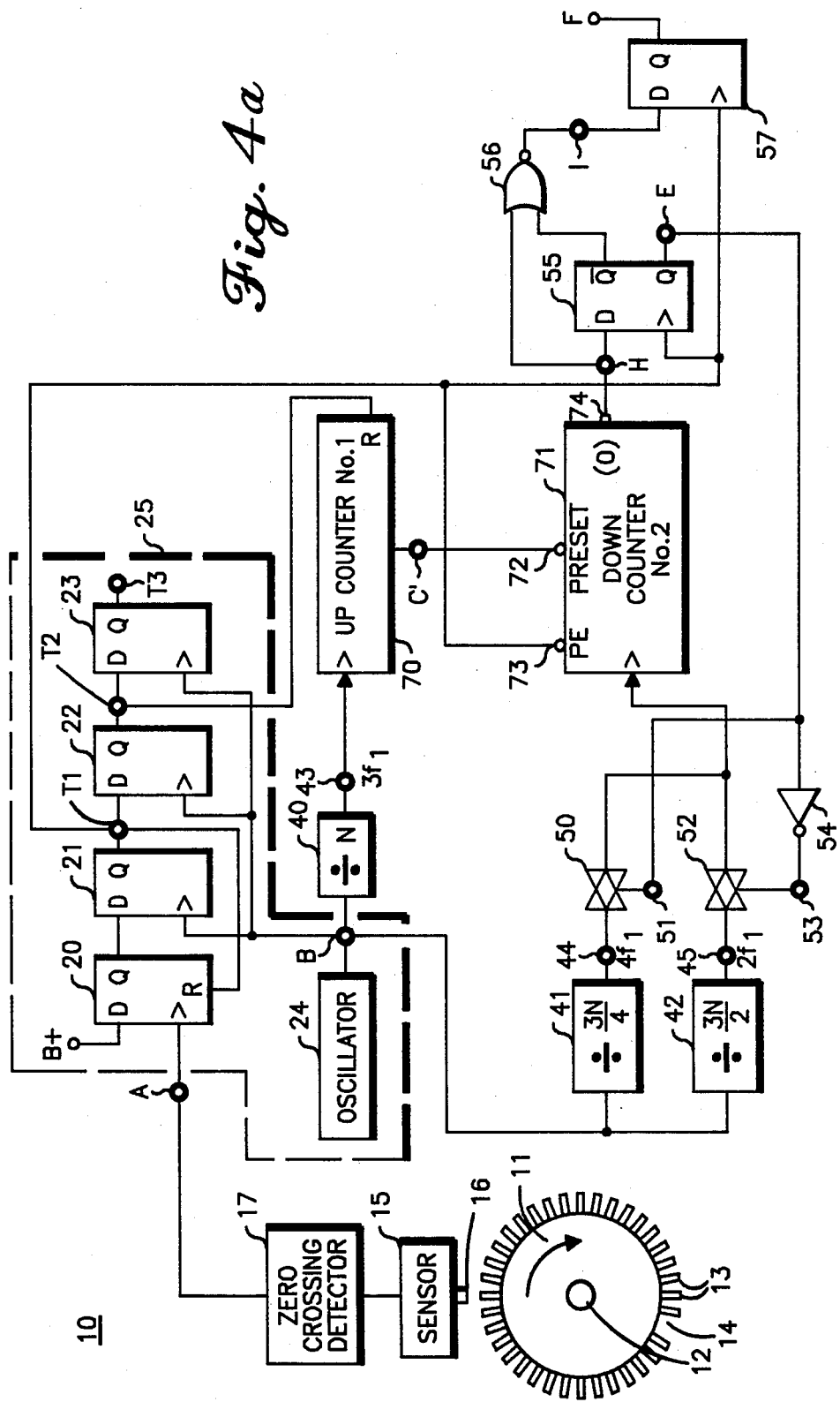

FIG. 4 illustrates an additional embodiment of the present invention in which corresponding identical components have been identified by corresponding identical reference numerals and letters. In the FIG. 4 embodiment essentially the up counter 46, latch 47, comparator 48 and down counter 49 have been replaced by an up counter 70 and a down counter 71. The up counter 70 has its count input terminal connected to the terminal 43 and a reset terminal of the counter is connected to the terminal $T_2$ while the accumulated count of the counter is provided at a terminal C' equivalent to the terminal C in FIG. 1. The terminal C' is connected to a preset terminal 72 of the down counter 71 which has its count input terminal connected through the gates 50 and 52 to the terminals 44 and 45. A preset enable terminal 73 of the down counter 71 is connected to the terminal $T_1$ and an output terminal 74 of the counter is directly connected to the terminal H. The down counter 71 provides a high logic signal at the terminal 74 when it has achieved a count of zero or less. It is understood that latching structure can be used with the counter 71 to prevent the counter from counting below zero.

Essentially, the FIG. 4 embodiment effectively utilizes the count of the counter 70 as a preset for the count of the down counter 71 which is then downward incremented after being preset at the rates $2f_1$ or $4f_1$ until a zero count is obtained resulting in a high logic signal at the terminal 74. This is equivalent to the function of the elements 46 through 49. The embodiments in FIGS. 1 and 4 both effectively compare the maximum accumulated count related to a first time duration $td_1$ between successive pulse train pulses to a subsequent accumulated count related to a second pulse train time duration $td_2$ between successive pulses. In the event of a substantial deceleration resulting in a longer second time duration between pulse train pulses, both embodiments effectively compare a subsequent third pulse train duration $td_3$ with a signal representative of the pulse train duration $td_2$ to determine if an actual missing pulse detection occurrence exists.

While we have shown and described specific embodiments of this invention, further modifications and improvements will occur to those skilled in the art. Such modifications could comprise utilization of separate up and down counters for each of the counters 46 and 49 shown in FIG. 1. Additional modifications could comprise utilizing the techniques of the present invention to implement an extra pulse detector for a variable frequency periodic pulse train signal wherein instead of detecting the absence of a periodic pulse train pulse the detection of an additional pulse train pulse is intended to result in the production of a pulse train reference position signal. In addition, some embodiments may choose to compare a signal related to the subsequent time duration $td_3$ directly with a signal related to the first time duration $td_1$ rather than with a signal related to the second time duration $td_2$, even though these are still effectively comparing the time duration $td_3$ with the time duration $td_2$. All such modifications which retain the basic underlying principles disclosed and claimed herein are within the scope of this invention.

We claim:

1. A pulse detector for producing a pulse detection output signal in response to either an absence of a pulse or an occurrence of an extra pulse in a variable frequency periodic pulse train signal, said detector comprising:

first means for receiving a variable frequency periodic pulse train signal, comprising periodic pulses having a predetermined repetition rate, and providing an arming output signal in response to a second time duration between successive pulse train pulses which exceeds in one polarity sense by a first predetermined amount a first preceding time duration between successive pulse train pulses, and second means coupled to said first means for receiving said arming output signal and providing a pulse detection output signal in response to the providing of said arming output signal and a third time duration, between successive pulse train pulses subsequent to said second time duration, which exceeeds in an opposite polarity sense, by a second predetermined amount, said second time duration, whereby the occurrence of a missing or extra pulse indicated by said pulse detection output signal is more readily distinguishable from a reduction or increase in the predetermined repetition rate of the periodic pulses in the variable frequency periodic pulse train signal.

2. A pulse detector according to claim 1 wherein said first means includes means for developing a first time duration signal during and related to said first preceding time duration, said first means also including means for effectively comparing said first time duration signal with a second time duration signal developed during and related to said second time duration to provide said arming output signal.

3. A pulse detector according to claim 2 wherein said first means includes a first pulse counter for counting a plurality of clock pulses occuring at a first frequency during said first preceding time duration and thereby developing an accumulated count, the accumulated count of these pulses substantially at the end of said first time duration comprising an end count determining said first time duration signal.

4. A pulse detector for producing a pulse detection output signal in response to either an absence of a pulse or an occurrence of an extra pulse in a variable frequency periodic pulse train signal, said detector comprising:

first means for receiving a variable frequency periodic pulse train signal, comprising periodic pulses having a predetermined repetition rate, and providing an arming output signal in response to a second time duration between successive pulse train pulses which exceeds in one polarity sense by a first predetermined amount a first preceding time duration between successive pulse train pulses, and second means coupled to said first means for receiving said arming output signal and providing a pulse detection output signal in response to the providing of said arming output signal and a third time duration, between successive pulse train pulses subsequent to said second time duration, which exceeeds in an opposite polarity sense, by a second predetermined amount, said second time duration, whereby the occurrence of a missing or extra pulse indicated by said pulse detection output signal is more readily distinguishable from a reduction or increase in the predetermined repetition rate of the periodic pulses in the variable frequency periodic pulse train signal, wherein said first means includes means for developing a first time duration signal during and related to said first preceding time duration, said first means also including means for effectively comparing said first time duration signal with a second time duration signal developed during and related to said second time duration to provide said arming output signal, wherein said first means includes a first pulse counter for counting a plurality of clock pulses occuring at a first frequency during said first preceding time duration and thereby developing an accumulated count, the accumulated count of these pulses substantially at the end of said first time duration comprising an end count determining said first time duration signal, wherein said first means includes a second pulse counter for counting a plurality of clock pulses occurring at a second frequency during said second time duration and thereby developing an accumulated count, the accumulated count of these pulses determining said second time duration signal.

5. A pulse detector according to claim 4 wherein said first means includes count comparator means for effectively comparing said end count developed by said first counter with the counts developed by said second counter and providing said arming output signal in response to the relationship therebetween.

6. A pulse detector for producing a pulse detection output signal in response to either an absence of a pulse or an occurrence of an extra pulse in a variable frequency periodic pulse train signal, said detector comprising:

first means for receiving a variable frequency periodic pulse train signal, comprising periodic pulses having a predetermined repetition rate, and providing an arming output signal in response to a second time duration between successive pulse train pulses which exceeds in one polarity sense by a first predetermined amount a first preceding time duration between successive pulse train pulses, and second means coupled to said first means for receiving said arming output signal and providing a pulse detection output signal in response to the providing of said arming output signal and a third time duration, between succesive pulse train pulses subsequent to said second time duration, which exceeeds in an opposite polarity sense, by a second predetermined amount, said second time duration, whereby the occurrence of a missing or extra pulse indicated by said pulse detection output signal is more readily distinguishable from a reduction or increase in the predetermined repetition rate of the periodic pulses in the variable frequency periodic pulse train signal wherein said first means includes means for developing a first time duration signal during and related to said first preceding time duration, said first means also including means for effectively comparing said first time duration signal with a second time duration signal developed during and related to said second time duration to provide said arming output signal, wherein said second means includes means for developing a third time duration signal related to said third time duration, and wherein said second means includes means for effectively comparing this third time duration signal with a signal developed by said first means related to said second time duration, said second means providing said pulse detection output signal in response to both comparing said third time duration signal to said signal related to said second time duration to determine that said third time duration exceeds said second time duration in said opposite sense by said predetermined amount and in response to said arming output signal.

7. A pulse detector according to claim 6 wherein said first means includes a first pulse counter for counting a plurality of clock pulses occuring at a first frequency during said first preceding time duration and thereby development an accumulated count, the accumulated count of these pulses substantially at the end of said first time duration determining said first time duration signal.

8. A pulse detector according to claim 7 wherein said first means includes a second counter for counting a plurality of clock pulses occuring at a second frequency during said second time duration and thereby developing an accumulated count, the accumulated count of these pulses determining said second time duration signal which is effectively compared to said first time duration signal to provide said arming output signal.

9. A pulse detector according to claim 8 wherein said second means includes at least one counter means for counting pulses and determining said pulse detection output signal.

10. A pulse detector according to claim 9 wherein said counter means of said second means includes said first counter for developing said second time duration signal to be effectively compared with said third time duration signal, and said counter means of said second means includes said second counter for developing said third time duration signal.

11. A pulse detector according to claim 10 wherein in response to said arming output signal, said second means provides said third time duration signal by providing during said third time duration clock pulses for counting by said second counter which have a different rate of occurrence from the clock pulses counted by said second counter during said second time duration.

12. A missing pulse detector for producing a missing pulse detection output signal in response to an absence of a pulse in a variable frequency periodic pulse train signal, said detector comprising:

first means for receiving a variable frequency periodic pulse train signal, comprising periodic pulses having a predetermined repetition rate, and providing an arming output signal in response to a second time duration between successive pulse train pulses which exceeds, by a first predetermined amount, a first preceding time duration between successive pulse train pulses, and second means coupled to said first means for receiving said arming output signal and providing a missing pulse detection output signal in response to the providing of said arming output signal and a third time duration between successive pulse train pulses subsequent to said second time duration being less than, by a second predetermined amount, said second time duration, whereby the occurrence of a missing pulse indicated by said missing pulse detection output signal is more readily distinguishable from a reduction in the repetition rate of the periodic pulses in the variable frequency periodic pulse train signal.

13. A pulse detector according to claim 12 wherein said first means includes means for developing a first time duration signal during and related to said first preceding time duration, said first means also including means for effectively comparing said first time duration signal with a second time duration signal developed during and related to said second time duration to provide said arming output signal.

14. A pulse detector according to claim 13 wherein said first means includes a first pulse counter for counting a plurality of clock pulses occuring at a first frequency during said first preceding time duration and thereby developing an accumulated count, the accumulated count of these pulses substantially at the end of said first time duration comprising an end count determining said first time duration signal.

15. A pulse detector for producing a missing pulse detection output signal in response to an absence of a pulse in a variable frequency periodic pulse train signal, said detector comprising:

first means for receiving a variable frequency periodic pulse train signal, comprising periodic pulses having a predetermined repetition rate, and providing an arming output signal in response to a second time duration between successive pulse train pulses which exceeds, by a first predetermined amount, a first preceding time duration between successive pulse train pulses, and second means coupled to said first means for receiving said arming output signal and providing a missing pulse detection output signal in response to the providing of said arming output signal and a third time duration between successive pulse train pulses subsequent to said second time duration being less than, by a second predetermined amount, said second time duration, whereby the occurrence of a missing pulse indicated by said missing pulse detection output signal is more readily distinguishable from a reduction in the repetition rate of the periodic pulses in the variable frequency periodic pulse train signal, wherein said first means includes means for developing a first time duration signal during and related to said first preceding time duration, said first means also including means for effectively comparing said first time duration signal with a second time duration signal developed during and related to said second time duration to provide said arming output signal, wherein said first means includes a first pulse counter for counting a plurality of clock pulses occuring at a first frequency during said first preceding time duration and thereby developing an accumulated count, the accumulated count of these pulses substantially at the end of said first time duration comprising an end count determining said first time duration signal, wherein said first means includes a second pulse counter for counting a plurality of clock pulses occurring at a second frequency during said second time duration and thereby developing an accumulated count, the accumulated count of these pulses determining said second time duration signal.

16. A pulse detector according to claim 15 wherein said first means includes count comparator means for effectively comparing said end count developed by said first counter with the counts developed by said second counter and providing said arming output signal in response to the relationship therebetween.

17. A pulse detector for producing a missing pulse detection output signal in response to an absence of a pulse in a variable frequency periodic pulse train signal, said detector comprising:

first means for receiving a variable frequency periodic pulse train signal, comprising periodic pulses having a predetermined repetition rate, and providing an arming output signal in response to a second time duration between successive pulse train pulses which exceeds, by a first predetermined amount, a first preceding time duration between successive pulse train pulses, and second means coupled to said first means for receiving said arming output signal and providing a missing pulse detection output signal in response to the providing of said arming output signal and a third time duration between successive pulse train pulses subsequent to said second time duration being less than, by a second predetermined amount, said second time duration, whereby the occurrence of a missing pulse indicated by said missing pulse detection output signal is more readily distinguishable from a reduction in the repetition rate of the periodic pulses in the variable frequency periodic pulse train signal, wherein said first means includes means for developing a first time duration signal during and related to said first preceding time duration, said first means also including means for effectively comparing said first time duration signal with a second time duration signal developed during and related to said second time duration to provide said arming output signal, wherein said second means includes means for developing a third time duration signal related to said third time duration, and wherein said second means includes means for effectively comparing this third time duration signal with a signal developed by said first means related to said second time duration, said second means providing said missing pulse detection output signal in response to both comparing said third time duration signal to said signal related to said second time duration to determine that said third time duration is less than said second time duration by said predetermined amount and in response to said arming output signal.

18. A pulse detector according to claim 17 wherein said first means includes a first pulse counter for counting a plurality of clock pulses occuring at a first frequency during said first preceding time duration and thereby developing an accumulated count, the accumulated count of these pulses at the end of said first time duration determining said first time duration signal.

19. A pulse detector accoding to claim 18 wherein said first means includes a second counter for counting a plurality of clock pulses occuring at a second frequency during said second time duration and thereby developing an accumulated count, the accumulated count of these pulses determining said second time duration signal which is effectively compared to said first time duration signal to provide said arming output signal.

20. A pulse detector according to claim 19 wherein said second means includes at least one counter means for counting pulses and determining said pulse detection output signal.

21. A pulse detector according to claim 20 wherein said counter means of said second means includes said first counter for developing said second time duration signal to be effectively compared with said third time duration signal, and said counter means of said second means includes said second counter for developing said third time duration signal.

22. A pulse detector according to claim 21 wherein in response to said arming output signal, said second means provides said third time duration signal by providing during said third time duration clock pulses for counting by said second counter which have a different higher rate of occurrence from the clock pulses counted by said second counter during said second time duration.

23. A pulse detector according to claim 22 wherein said first means provides said first duration signal by providing during said first time duration clock pulses for counting by said first counter which have a rate of occurrence less than said higher rate of clock pulses for said second counter provided during said third time duration, but higher than the rate of clock pulses counted by said second counter during said second time duration.

* * * * *